United States Patent [19]

Suzuki

[11] 4,218,581
[45] Aug. 19, 1980

[54] HIGH FREQUENCY FLAT CABLE

[76] Inventor: Hirosuke Suzuki, 205-22 Ohaza Kitanaka, Saitama-ken, Tokorozawa City, Japan, 359

[21] Appl. No.: 974,329

[22] Filed: Dec. 29, 1978

[30] Foreign Application Priority Data

Dec. 29, 1977 [JP] Japan .................................. 52-159236

[51] Int. Cl.² .............................................. H01B 7/08
[52] U.S. Cl. ................................... 174/117 F; 174/36; 174/117 R; 174/117 FF
[58] Field of Search ................. 174/36, 117 R, 117 F, 174/117 M, 117 FF; 333/12, 33, 124, 125

[56] References Cited

U.S. PATENT DOCUMENTS

| 3,257,500 | 6/1966 | Rusch | 174/117 F X |
| 3,676,923 | 7/1972 | Reimer | 174/117 F X |
| 3,711,627 | 1/1973 | Maringulov | 174/117 M |
| 3,809,803 | 5/1974 | Helmcke | 174/117 F X |
| 4,000,348 | 12/1976 | Harlow | 174/117 F X |
| 4,095,042 | 6/1978 | Ross | 174/36 |

FOREIGN PATENT DOCUMENTS

| 2409363 | 9/1974 | Fed. Rep. of Germany | 174/117 F |
| 2304153 | 11/1976 | France | 174/117 F |

Primary Examiner—Richard R. Kucia
Attorney, Agent, or Firm—John S. Campbell

[57] ABSTRACT

A novel flat cable which has a number of parallel spaced conductors with tape segments having a conductive and insulative side woven between them at various positions along the length of the conductors. The weaving generally being done so that the conductive side touches alternate conductors. The whole complex may be encased in an outer insulation.

9 Claims, 4 Drawing Figures

HIGH FREQUENCY FLAT CABLE

FIELD OF THE INVENTION

This invention relates to flat cables which have been designed to have desired conductivity between conductors at specified positions.

BACKGROUND OF THE INVENTION

The recent trend towards miniaturization of circuitry has resulted in an increase in the density of wiring both inside and outside electronic instruments and a miniaturization of terminal sections.

This movement towards the miniaturization of instruments for the transmission of high frequency or rapidly rising pulse signals creates a requirement for impedance matching to prevent the reflection of such signals in the line itself or at the terminal or connector sections.

Space in miniaturized instruments is so limited, for example, that a flat cable must accomodate about 60 conductors in a width of 30 mm. It is very difficult, time-consuming and requires painstaking effort to effect impedance matching, pull-up, pull-down, etc., at terminal sections or near connectors on such cables by soldering such elements as resistors and condensers to each conductors.

In view of the above situation, the present inventor has carried out investigations on high-density wiring inside and outside miniaturized electronic instruments, and especially on materials suitable for wiring of, and connection to, sections requiring impedance matching, pull-up, pull-down, etc. This has led to the discovery of flat cables which are free of the various defects mentioned above which are found with conventional wiring materials, and which may be used in a variety of forms.

BRIEF DESCRIPTION OF THE INVENTION

The present invention overcomes the problems outlined above by using a novel flat cable which comprises a multiplicity of conductors arranged parallel to one another. In between these conductors is woven a tape segment which is either a two-sided tape, one side being conductive and the other an insulator, or two separate tapes, one conductive and one insulative, one on top of the other. The tape or tapes being woven between the conductor at specified intervals along the length of the conductors in such a manner that the insulative or conductive side alternately touches a conductor. The above described construction is then encased in an insulating medium by any of a variety of well known means such as lamination or extrusion.

DETAILED DESCRIPTION OF THE INVENTION AND DRAWINGS

Figure 1:
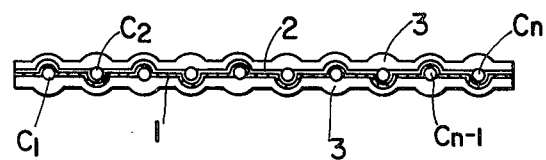
FIG. 1 shows a cross-sectional view for illustrating an example of flat cable made in accord with the present invention.

Those conductors which may be used in the present invention are any ordinary linearly conductive materials, e.g., copper and copper alloy wires with or without tin or silver plating. They are generally of a circular or rectangular cross-section and of a diameter of 1 mm or less. These conductors may be of either stranded wire, overcoat wire obtained from stranded wire through overall plating, or solid wire. In the process of cable manufacture, such conductors labeled $C_1, C_2, C_3, \ldots, C_{n-1}$, and $C_n$ in FIG. 1 are fed in the same plane, at spaced intervals between one another and into an extruding machine or calender roll from their respective reels on a wire hanger via various guiding means such as a grooved roll. Conductors, two or more in number, may be arranged either with equal or unequal spacing. The spacings may be selected in accordance with the desired end-use of the cable. It is generally preferable to make them correspond to the spacing of commercially-available connectors or terminals. For example, it is useful to arrange wires at equal spacings of 2.54 mm, or with spacings of 0.53 and 0.1 mm alternately disposed in a ratio of 1:2.

The conductive layers shown as 1 in the drawings, which may be used in the present invention are either metal foil materials made of copper, aluminum, nichrome steel, etc., or thermoplastic resins with conductive materials mixed into them by suitable means.

Examples of the above-mentioned thermoplastic resins are polyvinylchloride (PVC), polyolefins, and various fluororesins, of which PVC and polytetrafluoroethylene (PTFE) are most preferable. Examples of materials for the above-mentioned conductive powder materials are graphite powder, carbon black powder, carbon fiber, various metal powders (platinum, gold, silver, titanium, and tantalum powders), cermet (titanium carbide, chromium, etc.), metal nitrides (titanium nitride, aluminum nitride, etc.), metal borides (titanium boride, zirconium boride, etc.), metal silicides (molybdenum silicide, etc.), metal oxides (conductive oxides derived from $Cu_2O$, $TiO$, $VO$, $MnO$, $CoO$, $NiO$, $ZnO$, or $CaO$ through the process of making the oxygen ratio in the oxide indefinite), metallic semiconductors, and organic semiconductors. In addition to conductive materials, the thermoplastic resin may be subject to mixing with a coloring material for identification or with fluororubber for strength promotion.

The mixing ratio of the conductive material to the thermoplastic resin should be such that the resulting mixture not only satisfies the desired conductivity but is also viscoelastic enough to be suitable for molding processes such as extruding and rolling, this being ordinarily 5–70 wt. % (the content of the conductive material in the mixture), and preferably 10–50 wt. %. For the mixing of the conductive material with the thermoplastic resin, any method may be chosen which is suited to the physical properties of the mixed component; liquid lubricant (at ca. 20 wt. %) may be used in the mixing. When PTFE is used as the resin, the mixing mentioned above may be carried out, for example, in accordance with U.S. Pat. No. 3,315,020, or a solvent having a conductive material dispersed in it may be impregnated into a porous PTFE sheet which has been obtained by stretching a PTFE unsintered raw tape according to U.S. Pat. No. 3,953,566, and U.S. Pat. No. 4,096,227 or a liquid precursor of the conductive material may be incorporated in PTFE powder or its molded product and then converted into the conductive material by means of chemical and/or physical treatments such as heating and hydrolysis. In any of the methods cited above, if there is a possibility of the contained conductive material flowing out, it may be fixed to the base material with a gap-filling agent.

Application of the above-mentioned methods can produce conductive plastic materials in the form of sheet or tape which meet a wide range of electric resistance requirements; in general, those having volume resistivities in the range of 1–1,000 Ω cm are of practical use.

The inner insulating layer shown as 2 in the drawings, which is directly in contact with the conductive tapes or foils, may be made of a variety of plastics in ordinary use for cable manufacture (e.g., polyolefin, polyester, nylon-fluororesin, and PVC). Major criteria for the choice are cable specifications (electric properties, dimensions, and condition of use) and the thermal resistance required for the manufacturing process. Fluororesins (e.g., PTFE, FEP, PFA, ETFA, and PVDF) are preferable when high electric and thermal properties are called for.

Figure 2:
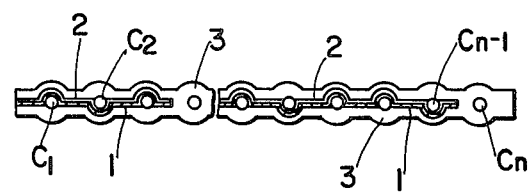
FIG. 2 shows a split cross-sectional view for the same purpose.
Figure 3:
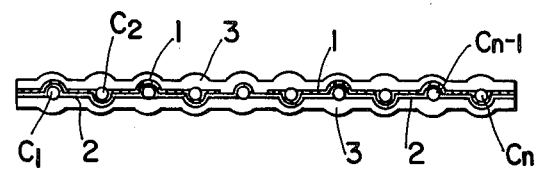
FIG. 3 shows a cross-sectional view for the same purpose.
Figure 4:
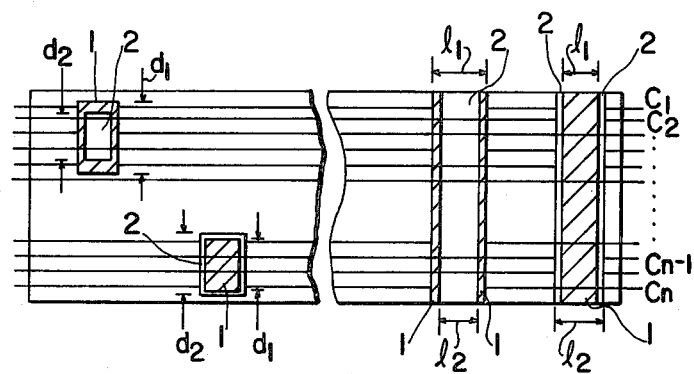
FIG. 4 shows a plan view for illustrating the structures of the inner insulating and conductive layers adopted in some examples of flat cables made in accord with the present invention.

The conductive layer 1 and the inner insulating layer 2 mentioned above which constitute the tape segment are bound in a prescribed positional relationship to the set of conductors ($C_1, C_2, \ldots, C_n$) which have been arranged parallel to one another at prescribed spacings. The positional relationship may be determined by the cable features and use; some representative concrete examples will be explained with reference figures. First, in FIGS. 1, 2, and 3 (sectional views) and FIG. 4 (plan view), the conductive layer 1 and the inner insulating layer 2 are in a laminated state (layers are either simply placed together or bonded to one another) and woven at intervals between the conductors which are in a parallel relationship. The relative number of conductors touching the conductive layer and those touching the insulative layer is ordinarily one each, for example, as in FIG. 1, or two and one, for example, as in FIG. 2; irregular dispositions are also usable in conformity with the usage of the flat cable. In order to attach the conductive layer 1 and inner insulating layer 2 to the set of parallel conductors at the desired positions, the conductors are simply separated into the desired two upper and lower groups, for example, every other conductor, while being fed from the wire feeder (wire hanger) to the pressure roll via the guide roll, and the conductive and insulating layers are caused to be fed or placed between the groups. The widths of the conductive layer 1 and inner insulating layer 2, $d_1$ and $d_2$, respectively, may range, as shown in FIG. 4, from a minimum enough to cover only two conductors to a maximum sufficient to cover the whole width; all possible relations are available; i.e., $d_1 = d_2$, $d_1 > d_2$, and $d_1 > d_2$. As to the lengths $l_1$ and $l_2$, all the three possible relations $l_1 = l_2$, $l_1 > l_2$, and $l_1 > l_2$ are usable and each length may arbitrarily be varied from about 0.1 mm to the total cable length in accordance with the required cable features, and especially with regard to the desired inter-wire resistance.

The conductive layer 1 and the inner insulating layer 2 may exist as separate layers laid one on top of the other. The conductive layer 1 may be bonded to the insulating layer 2.

The complex formed by the conductor, inner insulating layer and conductive layer (tape segment), arranged in the above-mentioned relationship, is enclosed within an outer insulating layer 3 in the drawings. To complete this covering, for example, the complex is sandwiched between two outer insulating layers (of sheet or tape) and passed through pressure rolls under suitable conditions (usually it is heated) in order that the insulating material used be heated into a unitized product, or extruded fused insulating material is used to envelope the complex to form a flat cable. In the case where the conductive resin layer, inner insulating layer, and outer insulating layer are all of PTFE, the first two components are first placed onto the plural number of conductors as described above, then the outer layers are placed, before the pressure rolls, onto both sides of the 3-component complex, and the assembly is pressure-bonded between the pressure rolls by the method specified in U.S. Pat. No. 3,082,292 or 3,540,956. The intermediate unheated PTFE product thus obtained is subject to heating over 327° C. and then to trimming of its edges and ends in order to form the complete product. To make the outer insulating layer 3, as in the case of the inner insulating layer, various thermoplastic resins may be used such as polyvinylchloride, polyolefins, and fluororesins; fluororesins (e.g., PTFE, FEP, PFA, and ETFE) are preferable when it is planned that the cable product from the present invention be exposed to high temperatures and corrosive atmospheres.

The flat cables produced by the present invention may be used for many purposes. Examples of uses are in long transmission lines equipped at the terminals with conductive layers effective for impedance matching, pull-up, pull-down, etc., resistor element arrays of the type used for matching impedance among lines, for which the flat cable is cut into short pieces and then the covering of each piece is removed at one end and connected to holes or terminals on a printed circuit board containing ICs; and an element array for which the covering of a flat cable piece is removed on both ends to form a group of jumper cables.

The flat cables from the present invention provide the following advantages:

(1) In a cable, lines may be combined in any other, regular or irregular, with one another via desired electric resistances.

(2) Impedance matching is easy to achieve.

(3) High-density wiring is achievable.

(4) When fluororesins are used as the insulating material, the product is imparted with thermal resistance, incombustibility, and chemical resistance.

The present invention will be illustrated by the following examples.

EXAMPLE 1

Forty-three silver-plated copper wires 0.29 mm in diameter, alternately divided into an upper and a lower group, were fed from a wire hanger onto pressure rolls via a guide roll. As the conductive layer, copper foils, 1 mm in length ($l_1$) and 0.1 mm in thickness were placed on raw PTFE tapes 5 mm in length ($l_2$) and 0.1 mm in thickness used as the inner insulating layer and inserted between both the conductor groups in a direction perpendicular to the longitudinal direction at intervals of 30 mm.

Just before the pressure rolls, two sheets of unsintered PTFE, 0.3 mm in thickness were applied so as to cover the complex of the above-mentioned three components, and the product unitized by the pressure rolls was heated at 390° C. for one minute and then both its edges were trimmed to form a flat cable as shown in FIG. 1. The flat cable thus prepared as 27.8 mm in width and had a characteristic impedance of 100Ω.

A 3 m length of the cable obtained was cut out in such a way that there were copper-foil parts at both ends, and was installed into a transmission circuit in the configuration of S (signal line), G (ground line), S, G, . . . , the ground line being formed as a common ground with one copper foil. This transmission line was found capable of good pulse transmission when applied to the transmission of pulses of 10-ns rise-time and 40-ns pulse width.

In contrast, with a conventional flat cable without any conductive layers, laborious work was needed to connect the 22 ground lines to each other.

In addition, the flat cable of the present invention can complete a connection with a 22-pin connector, whereas conventional flat cables requires 45-pin connectors.

EXAMPLE 2

A flat cable was prepared by a laminating process similar to that of Example 1 with 43 silver-plated copper wires 0.29 mm in diameter as the conductor, an unheated PTFE tape 0.1 mm thickness and 48 mm wide as the inner insulating layer, an unheated 0.1 mm thick 50 mm wide PTFE tape made conductive with incorporated graphite powder as the conductive layer, and two unheated PTFE tapes 0.3 mm thick as the outer insulating layers. The cross-section of the flat cable thus obtained had a 2:1 conductor configuration (wire spacing of 0.9 mm) as shown on the right side of FIG. 2, and the composition of the conductive and inner insulating layers was as shown by the second right plan view portion of FIG. 4; the spacing between conductive layers was 3 m and the characteristic impedance 130Ω.

The flat cable obtained, which had the configuration of G, S, S, G, S, S, G, . . . , had pulse-transmitting ICs connected with each S at one end and pulse-receiving ICs connected with each S at the other end and was used for the balanced transmission of pulse signals. The resistances between both S and G (two places) and S and S were 390Ω, and when a balanced transmission line was made from the flat cable, the combined resistance at the flat cable end was 130Ω, in agreement with the characteristic impedance of the cable; the resistance between G and G was found to be as low as 5Ω. In a test where this transmission line was used for the transmission of pulsed signals of 5-ns rise-time and 30-ns pulse width, no occurrence of unmatched pulse reflection, signal reflection at the cable ends, or signal leakage was found.

I claim:

1. A flat cable for the purpose of transmitting high frequency electromagnetic waves comprising:
   (a) a plurality of parallel spaced conductors in a plane;
   (b) a plurality of tape segments having a conductive side and an insulative size woven transversely between said conductors at prescribed positions;
   (c) an insulation covering said conductors and said tape segments.

2. The flat cable of claim 1 in which said tape segments cover longitudinally a portion of said cable.

3. The flat cable of claim 1 in which said tape segments cover longitudinally the entire cable.

4. The flat cable of claim 1 in which said tape segments are two-sided.

5. The flat cable of claim 1 in which said tape segments are two tapes; one conductive and one insulative laid one on top of the other.

6. The flat cable of claim 1 in which said tape segments have a metal foil as said conductive side.

7. The flat cable of claim 1 in which said tape segments have a thermoplastic resin with a conductive filler contained therein as said conductive side.

8. The flat cable of claim 1 in which said tape segments have a polytetrafluoroethylene tape as said insulative side.

9. The flat cable of claim 1 in which said insulating medium is polytetrafluoroethylene.

* * * * *